United States Patent [19]

Tung

[11] Patent Number: 4,739,306

[45] Date of Patent: Apr. 19, 1988

[54] CALIBRATED-WEIGHT BALANCE AND AN ANALOG-TO-DIGITAL CONVERTER IN WHICH THE BALANCE IS EMPLOYED

[75] Inventor: Pham N. Tung, Paris, France

[73] Assignee: Thomson-CSF, Paris, France

[21] Appl. No.: 927,724

[22] Filed: Nov. 7, 1986

[30] Foreign Application Priority Data

Nov. 15, 1985 [FR] France ................... 85 16933

[51] Int. Cl.$^4$ ............................................ H03M 1/36
[52] U.S. Cl. ........................... 340/347 AD; 331/113 R; 331/145; 307/261
[58] Field of Search ............... 307/261; 331/113 R, 331/145; 340/347 AD

[56] References Cited

U.S. PATENT DOCUMENTS 4,291,246 9/1981 Martino, Jr. et al. ............... 307/475

OTHER PUBLICATIONS

RCA Review, vol. 41, Juin 1980, pp. 198–212, Princeton, US; L. C. Upadhyayula: "GaAs MESFET Comparators for Gigabit-Rate Analog-to-Digital Converters", *FIGS. 1,3,9; p. 204, lignes 1–7*.
Patents Abstracts, vol. 7, No. 49 (E-161), [1194], 24 Fevrier 1983; & JP-A-57 199 322 (Daini Selkosha K.K.), 07-12-1982.

Primary Examiner—William M. Shoop, Jr.
Assistant Examiner—Richard K. Blum
Attorney, Agent, or Firm—Cushman, Darby & Cushman

[57] ABSTRACT

A calibrated-weight balance for converting an electrical analog signal to a binary signal as applicable to flash-type analog-to-digital converters is composed of a bistable multivibrator having two transistors (15, 16) and two resistors (25, 26). In the reference channel (15, 25), a current $I_0$ flows through a resistor (27) connected between drain and ground. In the measuring channel (16, 26), a transistor (17) is connected between a reference voltage ($-V_{ref}$) and the drain of the measuring transistor (16). The input of the balance ($V_E$) is the gate of the third transistor (17). The outputs (Q, Q̄) of the balance are the drains of the first and second transistors (15, 16). The resistor (26) for supplying the second transistor (16) constitutes the calibrated weight and permits the flow of a current which is a multiple of the current which flows through the resistor (27) of the reference channel.

8 Claims, 1 Drawing Sheet

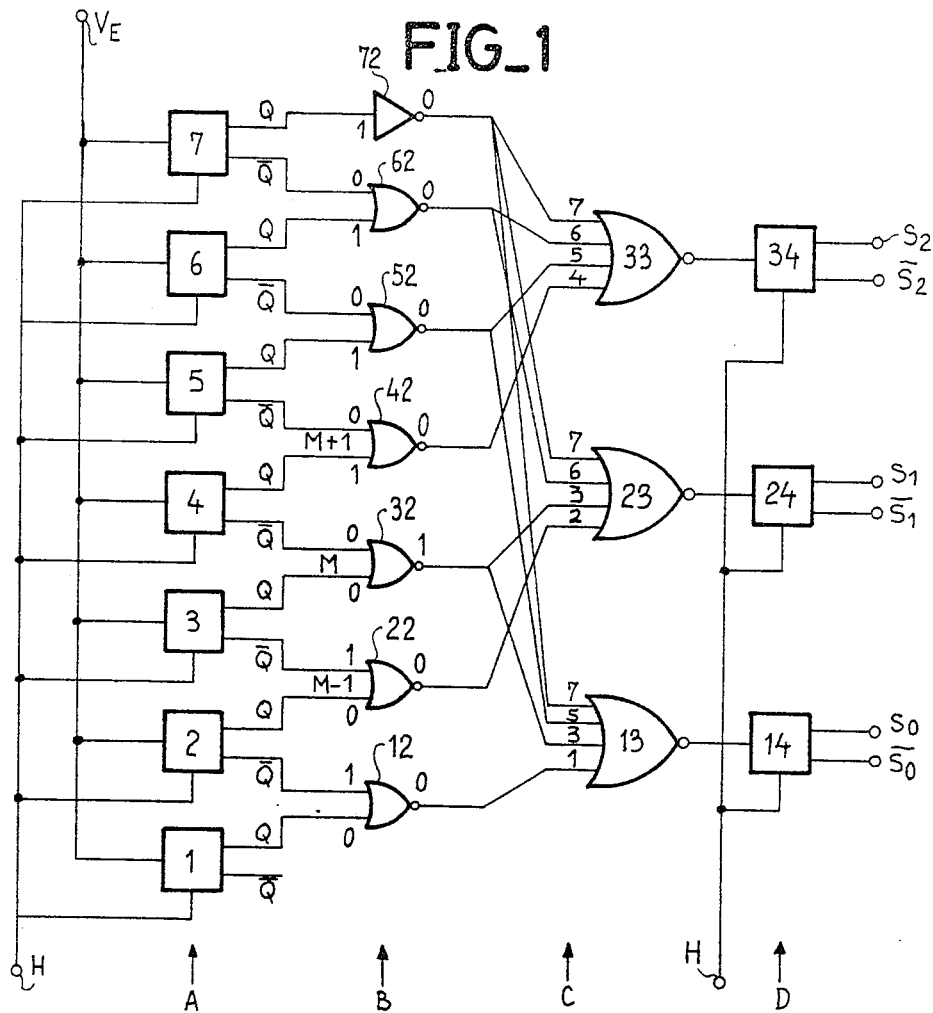
FIG_1
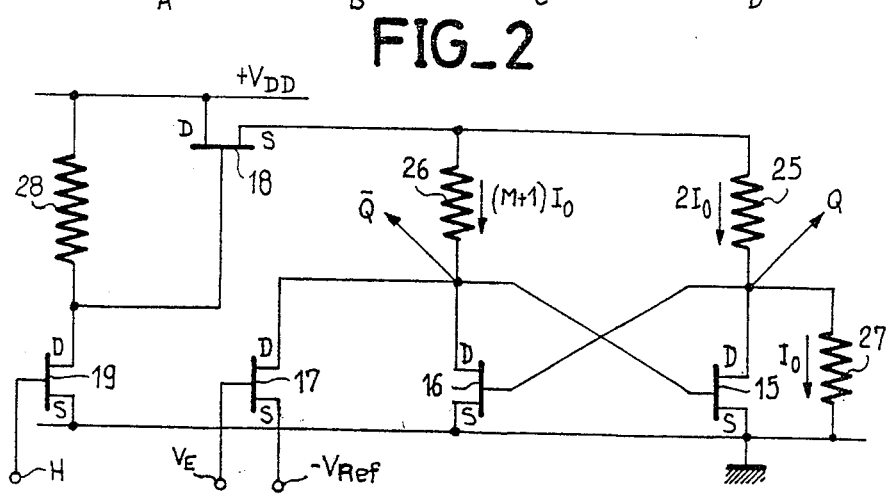
FIG_2

CALIBRATED-WEIGHT BALANCE AND AN ANALOG-TO-DIGITAL CONVERTER IN WHICH THE BALANCE IS EMPLOYED

BACKGROUND OF THE INVENTION

1. Field of the Invention

The present invention relates to a calibrated-weight balance for the construction of very-high-speed analog-to-digital converters. This balance makes use of a Schmitt trigger consisting of normally-off transistors and having dimensions calculated so that the trigger or bistable circuit changes state as a function of the value of the input signal with respect to the value of one of the two drain resistors of the transistors, which is precisely the calibrated-weight resistor.

2. Description of the Prior Art

Analog-to-digital converters are widely employed in many different kinds of equipment, for processing analog signals transmitted by overhead lines or by coaxial cable. However, they constitute a weak point in the signal-processing chain by because of their relatively slow speed. For instance earth-orbiting satellites are provided with electronic systems operating at several gigahertz. Other types of equipment utilize the transparency of the atmosphere at 94 GHz, however the medium-resolution analog-to-digital converters at present known have a speed of the order of 500 MHz.

By utilizing normally-off two-dimensional electron-gas transistors and by virtue of a very simple design concept, the calibrated-weight balance in accordance with the invention permits the construction of analog-to-digital converters which operate at rates above 2 GHz with a resolution of five or six bits, for example.

Basically, the balance in accordance with the invention consists of a bistable multivibrator of the Schmitt trigger type in which two field-effect transistors (FETs) are supplied by a third transistor which operates as a current source and is in turn controlled by a clock signal through a direct-coupled FET logic inverter (DCFL inverter).

A first transistor of the bistable multivibrator type constitutes the reference channel and is mounted with a grounded source whilst its drain is connected to the center tap of a divider. This divider is constituted by a resistor connected to ground and by a resistor connected to the current source. These two resistors are fixed.

A second transistor of the bistable multivibrator constitutes the measuring channel and is mounted with a grounded source, its drain being connected to the center tap of a divider. Said divider is constituted by a resistor connected to the current source and by a third transistor, the source of which is connected to a reference voltage. The input analog signal is applied to the gate of said third transistor and the measuring channel supply resistor constitutes the calibrated weight of the balance in accordance with the invention.

The two complementary outputs of the balance are taken from the drains of the two transistors of the bistable multivibrator. Depending on the value of the analog signal applied to the gate of the third transistor, one of these two outputs is at the logic level 1 and the other output is at the logic level 0 or conversely.

In an analog-to-digital converter which makes use of the balances in accordance with the invention, each balance is characterized by its resistor in series with the third transistor, the value of this latter being dependent on the rank of the balance in the converter.

SUMMARY OF THE INVENTION

In more precise terms, the present invention relates to a calibrated-weight balance for converting an electrical analog signal to a binary signal, in which the reference channel of a bistable multivibrator is constituted by a first field-effect transistor mounted with a grounded source and supplied by its drain through a first resistor, and in which the measuring channel of said bistable multivibrator is constituted by a second field-effect transistor mounted with a grounded source and supplied by its drain through a second resistor, the gate of each transistor being controlled by the drain of the other transistor, and the supply voltage applied to the first and second resistors being controlled by a clock signal, said balance being distinguished by the fact that:

in the reference channel, a third resistor is connected between ground and the drain of the first transistor from which a first output of the balance is taken, in the measuring channel, a third transistor is connected between a negative reference voltage on its source and the drain of the second transistor from which a second output of the balance is taken, the input of said balance being constituted by the gate of the third transistor, the values of the three resistors are such that the current which flows through the first resistor has twice the value of the current which flows through the third resistor and that the current flowing through the second resistor which constitutes the calibrated weight of the balance is a multiple of the current which flows through the third resistor, said multiple being between 2 and (M+1), where M characterizes the weight of the balance.

BRIEF DESCRIPTION OF THE DRAWINGS

FIG. 1 is an electrical diagram of an analog-to-digital converter and is known per se but comes within the scope of the invention insofar as the calibrated-weight balances are designed in accordance with the invention.

FIG. 2 is an electrical diagram of a calibrated-weight balance in accordance with the invention.

DETAILED DESCRIPTION OF THE INVENTION

In order to gain a more complete understanding of the operation of a calibrated-weight balance, it will prove useful at the outset to recall the structure and operation of an analog-to-digital converter as illustrated schematically in FIG. 1.

In accordance with known practice, an analog-to-digital converter has four stages as designated by the letters A to D in FIG. 1.

The first stage A is constituted by a series of balances 1 to 7, an analog input signal $V_E$ and a clock signal H being applied to each balance at parallel inputs. This series of balances is often designated as a thermometer scale. In fact, if M designates the rank of a balance in the scale, all the balances in which the input signal level is higher than the calibrated weight of a balance have outputs Q=logical 0 and $\overline{Q}$=logical 1 up to the balance of rank M. All the balances in which the input signal level is lower than the calibrated weight of one balance have outputs Q =logical 1 and $\overline{Q}$=logical 0, starting from the balance of rank M. The output levels therefore recall a thermometer scale, that is, in which the outputs Q all have a logic level 0 up to the balance of rank M and all have a logic level 1 beyond this rank.

The number of balances (seven in the example considered) does not limit the scope of the invention but is related to the resolution of the converter and to the number of output bits. Thus $2^N-1$ balances are required for an N-bit digitized signal.

The second stage B is a first encoder which converts the thermometer scale to a scale of points. This encoder is constituted by a series of NOR-gates 12 to 62. Each NOR gate has a first input connected to the output Q of a balance of rank M and a second input connected to the output $\overline{Q}$ of a balance of rank M+1. In order to illustrate this operation, the logical 0 and logical 1 output levels are shown by way of example in FIG. 1, in which the thermometer scale extends to M=3. Only the NOR-gate 32 (M) which receives two logical 0 signals on its two inputs delivers a logical 1 signal at its output. All the other gates which have a rank lower than M or higher than M and receive logical 0s and 1s deliver a logical 0 signal at their outputs.

The first output $\overline{Q}$ of the first balance 1 is not utilized for measurement and is not connected to a NOR-gate. The second output Q of the last balance 7 is connected to a simple inverter 72 since a NOR-gate serves no useful purpose if it operates on only one input.

The third stage C is a second encoder which converts the scale of points to a binary number. This stage is constituted by a number of NOR-gates 13, 23 and 33, corresponding to the number of resolution bits for measuring the input signal $V_E$. In the case shown by way of example in the figure, N=3=3 bits. Each NOR-gate 13, 23 or 33 has a plurality of inputs which will be justified hereinafter.

The fourth stage D is constituted by D-type bistable multivibrators 14, 24, 34 which are N in number if there are N bits. All these D-type multivibrators have one input connected to one NOR-gate of the previous stage and are synchronized by the same clock signal H as the balances of the first stage. They deliver the digitized signals at their outputs S and $\overline{S}$, namely three bits in the example illustrated in the figure.

The binary number delivered by the second encoder or third stage C is recorded in the shift register formed by the fourth stage D. Synchronization by the sampling clock H enables the analog-to-digital converter to carry out a further sampling operation on the first stage of balances without losing the acquisition of the previous stage stored in the shift register.

A converter of this type is known as a "flash converter" and operates at a much higher speed than converters which make use of sample-and-hold circuits and counters.

This review of the operation of an analog-to-digital converter permits a clearer definition of the problem, which accordingly consists in designing balances 1 to 7 each characterized by a calibrated weight which makes it possible to mount these balances in series in order to form a thermometric scale. The speed of operation of each calibrated-weight balance is higher as its circuit arrangement achieves greater simplicity and the performances of the transistors forming part of the balance are higher. Thus field-effect transistors and more particularly heterojunction transistors with two-dimensional electron gas and fabricated from gallium arsenide or more generally from III-V materials are mandatory for the construction of integrated circuits although it will be understood that this choice does not imply any limitation of the invention as illustrated in FIG. 2.

The calibrated-weight balance is arranged around a bistable multivibrator, namely two crossed logic inverters formed by two field-effect transistors 15 and 16 and two resistors 25 and 26. The transistors 15 and 16 are connected to ground through their source and to the resistors 25 and 26 respectively through their drain. The opposite ends of said resistors 25 and 26 are connected together to a programmed current source.

The programmed current source is constituted by a field-effect transistor 18, the drain of which is connected to a voltage $+V_{DD}$ and the source of which is connected to the two aforementioned resistors 25 and 26. The gate of the transistor 18 is controlled by the output of a DCFL inverter formed by a transistor 19 and a resistor 28 which are both connected between ground and the voltage $+V_{DD}$. A clock signal H is applied to the gate of the transistor 19 of the inverter. It is consequently this signal which synchronizes the current source 18 and programs the operation of the balance.

The two transistors 15 and 16 of the bistable multivibrator operate in one case as a reference channel and in the other case as a measuring channel for "weighing" the input analog signal.

The reference channel is formed by a first transistor 15, the drain of which is connected to the common node between the aforementioned resistor 25 of the inverter and a third resistor 27, the other end of which is connected to ground.

The measuring channel is formed by a second transistor 16, the drain of which is connected to the common node between the aforementioned resistor 26 of the inverter and the drain of a third transistor 17, the source of which is connected to a negative reference voltage $-V_{ref}$ whose function will be explained hereinafter. The gate of said third transistor 17 constitutes the input of the balance of the invention to which an analog voltage $V_E$ is applied.

The complementary outputs Q and $\overline{Q}$ of the balance are taken from the drains of the first and second transistors 15 and 16.

The components which "weigh" the input analog signal $V_E$ are the three resistors 25, 26, 27 and the third transistor 17. The first and third resistors 25 and 27 have a fixed value which is common to all the balances of an analog-to-digital converter. Said resistors are so dimensioned that, if $I_0$ is the reference current which flows through the resistor 27, a current $2I_0$ accordingly flows through the resistor 25.

The second resistor 26 has a value which depends on the rank M of a balance within an analog-to-digital converter and a current $(M+1)I_0$ passes through said second resistor in the case of a balance having the rank M. It is this second resistor which constitutes the calibrated weight of the balance. The transistor 17, which has the same characteristics in the case of all the balances of a converter but in which the current varies with the signal $V_E$ to be measured, constitutes with the resistor 26 a variable measurement scale in contrast to the fixed measurement scale constituted by the fixed resistors 25 and 27.

The group of resistors 25, 26, 27 of the bistable multivibrator and even the resistor 28 of the current source are resistors of the saturable current type or in other words gateless transistors, or transistors in which a channel is etched in the active layer or else transistors in which holes are etched in the active layer beneath the gate metallization. All these types of saturable loads are well-known.

The operating conditions in the case of a two-dimensional electron-gas transistor 17 are as follows:

$V_T \leq V_{GS} < 1$ volt and
$V_{\bar{Q}} \leq V_T$ with
$V_{GS}$=gate-source voltage.

The first condition limits the input voltages $V_E$ as a function of the reference voltage $V_{ref}$. It is for this reason that the source of the third transistor 17 is connected to a negative reference voltage $-V_{ref}$. This is a matching voltage which permits conversion of analog signals having an input voltage $V_E$ of lower value than the threshold voltage $V_T$ of the transistors, all of which are normally-off transistors.

The second condition ensures that the transistor 15 is cut-off prior to switching. In order to permit "weighing" of an input signal by the balance, it is in fact necessary to ensure that the reference arm of the balance is not initially modified by a transistor 15 which has been triggered into conduction. It is for this reason also that all the transistors of the balance are of the normally-off type.

If it is considered that:
the drain voltage $V_D$ of the transistor 17 is equal to the voltage $V_{\bar{Q}}0$ of the output $\bar{Q}$
the gate voltage $V_G$ of the transistor 17 is equal to the input voltage $V_E$ to be measured,
the experimental laws of the transistors make it possible to write:

$V_{\bar{Q}} = V_E - V_T$ with
$I_{max} = G_m(V_{GS} - V_T)$ $G_m$ being the transconductance.

Three cases are to be considered:

(1)

$V_{ref} = V_S = 0$ volt
$V_T \leq V_E \leq 2V_T$ with the condition $2V_T < 1$ volt
$I_{max} = G_m V_T$ (2)

$V_{ref} = -V_T$
$0 \leq V_E \leq 2V_T$ with the condition $3V_T < 1$ volt
$I_{max} = 2G_m V_T$ (3)

$V_{ref} = -3V_T$
$-2V_T \leq V_E \leq +2V_T$ with the condition $5V_T < 1$ volt
$I_{max} = 4G_m V_T$ These three cases are summarized in the following table:

| $V_{ref}$ | 0 | $-V_T$ | $-3V_T$ |
|---|---|---|---|
| $V_{E}min$ | $V_T$ | 0 | $-2V_T$ |
| $V_{E}max$ | $2V_T$ | $2V_T$ | $2V_T$ |
| $V_T max$ | 0.5 volt | 0.33 volt | 0.2 volt |
| $I_{max}$ | $G_m V_T$ | $2G_m V_T$ | $4G_m V_T$ |

The first case corresponds to sampling of logic signals between $V_T$ (logical 0) and $2V_T$ (logical 1).

The second case corresponds to coding of signals between 0 and a maximum of $2V_T$.

The third case corresponds to alternating-current signals between $-2V_T$ and $+2V_T$.

The dimensions of the transistor 17 are determined as a function of its transconductance $G_m$, of the current $I_0$ and of the number N of binary bits of the converter, knowing that:

$I_{max} = (2^N - 1)I_0$

The balance operates as follows:

In the clock stage H=logical 1, the supply is cut-off since the gate of the transistor 18 is at the logic level 0, with the result that the Schmitt trigger circuit is not supplied and $V_Q = V_{\bar{Q}} = 0$ volt When H=logical 0, the trigger circuit is supplied and the gates of the transistors 15 and 16 are controlled by the following currents:

$I_{G16} = I_{25} - I_{27} = I_0$
$I_{G15} = I_{26} - I_{17}$ $I_{17}$ being the drain-source current which flows through the transistor 17;

If $I_{G15} > I_{G16}$, the transistor 15 is turned-on at a higher speed than the transistor 16, and in this case:

$V_Q$=logical 0 $V_{\bar{Q}}$=logical 1

If $I_{G15} < I_{G16}$, the transistor 16 is turned-on at a higher speed than the transistor 15, and $V_{\bar{Q}}$=logical 0 $V_Q$=logical 1

The limit between these two cases is:

$I_{26} - I_{17} = I_0$ which means that the two arms of the balance are in equilibrium. But by definition:

$I_{26} = (M+1)I_0$
$I_{17} = I_{26} - I_0 = MI_0 = G_m(V_{GS} - V_T) = G_m(V_E - V_{ref} - V_T)$ with the result that the input voltage $V_E$ is, at equilibrium, characterized by the rank M of the balance in a converter. All the balances which are lower in rank than M have outputs $V_Q$=logical 0 $V_{\bar{Q}}$=logical 1 and all the balances which are higher in rank than M have reversed outputs $V_Q$=logical 1 $V_{\bar{Q}}$=logical 0

In order to convert this thermometric scale to a scale of points, the output Q of a balance of rank M and the output $\bar{Q}$ of a balance of rank M+1 are connected to the inputs of a NOR-gate of rank M of the first encoder of a converter as shown in FIG. 1. The NOR-gate having two inputs equal to logical 0 alone delivers a logic level 1 at the output. By way of example, the gate considered is designated in FIG. 1 by the reference 32 and has the rank M=3. All the other gates having at least one input equal to a logical 1 have a logical 0 output level. The first encoder therefore delivers a scale of points.

Said scale of points is converted to a binary number by means of the second encoder having NOR-gates 13, 23 and 33 and by means of the shift register consisting of D-type flip-flops 14, 24 and 34 if coding is performed with three bits. It will readily be apparent that, if coding is carried out with a different number of bits, the number of gates and D-type flip-flops is modified accordingly.

Using the following notations:
$S_0$ the lowest-weight bit,
$S_1$ the medium-weight bit,
$S_2$: the highest-weight bit
and taking into account the fact that the coded number —from 1 to 7 in the example shown—is related to the output rank M of the scale of points, the following table serves to explain the wiring scheme adopted for the second encoder.

| Level M | 1 | 2 | 3 | 4 | 5 | 6 | 7 | Coded number |
|---|---|---|---|---|---|---|---|---|
| Bits S$_0$ | 1 | 0 | 1 | 0 | 1 | 0 | 1 | Decimal- |
| S$_1$ | 0 | 1 | 1 | 0 | 0 | 1 | 1 | binary |
| S$_2$ | 0 | 0 | 0 | 1 | 1 | 1 | 1 | conversion |

The wiring of each output of the second encoder follows the points at which the output of the first encoder has a value of 1. It is apparent that, for example, 7 has the same weight as 6+1 or 5+2 or 4+3.

The output S$_0$ is derived from the levels 1, 3, 5 and 7, that is to say from the gates 12, 32, 52, 72.

The output S$_1$ is derived from the levels 2, 3, 6 and 7, that is to say from the gates 22, 32, 62, 72.

The output S$_2$ is derived from the levels 4, 5, 6 and 7, that is to say from the gates 42, 52, 62, 72.

In more general terms, in order to construct an encoder having N binary bits, it is necessary to have a number N of NOR-gates 13, 23 . . . of $2^{N-1}$ inputs.

The following table gives a few characteristics in the case of two 5 and 6-bit converters:

| Number of bits | 5 | 6 |
|---|---|---|
| Number of balances | 31 | 63 |
| First encoder | 31 NOR-gates | 63 NOR-gates |
| Second encoder | 5 NOR-gates having 16 inputs | 6 NOR-gates having 32 inputs |
| D flip-flops | 5 | 6 |
| Sensitivity | 10 mV | 5 mV |
| Transition time | <400 ps | <400 ps |
| Operating frequency | >2 GHz | >2 GHz |

The calibrated-weight balance in accordance with the invention is applied to systems which call for high-speed digital-analog conversion such as measuring instruments or multiplexer-demultiplexers for satellite telecommunications.

Although electron-gas heterojunction transistors enable the balance to operate at high speeds exceeding 2 GHz, the basic design and circuit arrangement of the balance remain effective if transistors of different types are employed or if conventional variants within the scope of the appended claims are employed by those versed in the art.

What is claimed is:

1. A calibrated-weight balance for converting an electrical analog signal to a binary signal, having:
   a bistable multivibrator, said multivibrator comprising:
   (a) a reference channel having a first resistor, and a first field-effect transistor mounted with a grounded source and supplied by its drain through said first resistor,
   (b) a measuring channel which includes a second resistor, and a second field-effect transistor mounted with a grounded source and supplied by its drain through said second resistor, a gate of each of said first and second transistors being controlled by the drain of the other transistor, and a supply voltage applied to the first and second resistors being controlled by a clock signal
   (c) a third resistor, connected in the reference channel between ground and the drain of the first transistor, a first output of the balance being taken from a node between said third resistor and said drain of said first transistor, and
   (d) a third transistor connected in the measuring channel, a source of said third transistor connected to a negative reference voltage, and a drain of said third transistor connected to the drain of the second transistor, a second output of the balance being taken from a node between said drains of said second and third transistors, an input of said balance being constituted by the gate of the third transistor, wherein the values of said first, second and third resistors are such that twice as much current flows through the first resistor as compared with the current which flows through the third resistor, and that current flowing through the second resistor, which constitutes the calibrated weight of the balance, is a multiple of the current which flows through the third resistor, said multiple being between 2 and (M+1), where M characterizes the weight of the balance.

2. A calibrated-weight balance according to claim 1, further comprising fourth and fifth field effect transistors, the bistable multivibrator being supplied through said first and second resistors by said fourth field-effect transistor whose drain is connected to a supply voltage (+V$_{DD}$) and whose gate is connected to the drain of said fifth transistor mounted as an inverter which is gate-controlled by a clock signal.

3. A calibrated-weight balance according to claim 1, wherein the transistors are of the normally-off type.

4. A calibrated-weight balance according to claim 1, wherein the transistors are heterojunction transistors which operate with a two-dimensional electron gas.

5. A calibrated-weight balance according to claim 1, wherein the reference voltage applied to the source of the third transistor permits conversion of an input signal of lower value than the threshold voltage of said transistor.

6. A calibrated-weight balance according to claim 1, wherein the three resistors are of the saturable-load type consisting of gateless transistor structures.

7. An analog-to-digital converter of the "flash" type having a thermometer scale of calibrated-weight balances, each including a bistable multivibrator, each multivibrator comprising:
   (a) reference channel including a first resistor and a first field-effect transistor mounted with a grounded source and supplied by its drain through said first resistor,
   (b) a measuring channel which includes a second resistor and a second field-effect transistor mounted with a grounded source and supplied by its drain through said second resistor, a gate of each of said first and second transistors being controlled by the drain of the other transistor, and a supply voltage applied to the first and second resistors being controlled by a clock signal,
   (c) a third resistor, connected in the reference channel between ground and the drain of the first transistor, a first output of the balance being taken from a node between said third resistor and said drain of said first transistor, and
   (d) a third transistor connected in the measuring channel, a source of said third transistor connected to a negative reference voltage and a drain of said third transistor connected to the drain of the second transistor, a second output of the balance being taken from a node between said drains of said second and third transistors, an input of said balance being constituted by the gate of the third transistor, wherein values of said first, second and third resistors are such that twice as much current flows through the first resistor as compared with the current which flows through the third resistor, and that current flowing through the second resistor, which constitutes the calibrated weight of the balance, is a multiple of the current which flows through the third resistor, said multiple being between 2 and (M+1), where M characterizes the weight of the balance;

first NOR-gate encoder means coupled to said first and second outputs of said balance for converting said outputs from said calibrated balance into a scale of points;

second NOR-gate encoder means, coupled to receive said scale of points, for producing a binary number indicative thereof; and a shift register for receiving and shifting said binary number.

8. An analog-to-digital converter according to claim 7 wherein, in the "thermometer scale", a current $(M+1)I_0$ is allowed to pass through the second resistor of a weight balance of rank M.

* * * * *